(12) United States Patent
Bhalla

(10) Patent No.: US 11,158,999 B2
(45) Date of Patent: Oct. 26, 2021

(54) EQUIPMENT ENCLOSURE WITH SELF-SEALING MULTILAYER WALL STRUCTURE

(71) Applicant: Eaton Intelligent Power Limited, Dublin (IE)

(72) Inventor: Richard Bhalla, Fletcher, NC (US)

(73) Assignee: Eaton Intelligent Power Limited

( * ) Notice: Subject to any disclaimer, the term of this patent is extended or adjusted under 35 U.S.C. 154(b) by 216 days.

(21) Appl. No.: 16/444,765

(22) Filed: Jun. 18, 2019

(65) Prior Publication Data
US 2020/0403399 A1    Dec. 24, 2020

(51) Int. Cl.
*H02B 13/025* (2006.01)
*H05K 5/06* (2006.01)
*H01T 4/04* (2006.01)
*H02B 13/045* (2006.01)

(52) U.S. Cl.
CPC .......... *H02B 13/025* (2013.01); *H05K 5/069* (2013.01); *H01T 4/04* (2013.01); *H02B 13/045* (2013.01)

(58) Field of Classification Search
CPC .... H02B 13/025; H02B 13/045; H05K 5/069; H01T 4/04
See application file for complete search history.

(56) References Cited

U.S. PATENT DOCUMENTS

| | | | |
|---|---|---|---|
| 6,288,621 B1 | 9/2001 | Rival | |
| 6,388,867 B1 | 5/2002 | Rakus et al. | |
| 6,724,604 B2 | 4/2004 | Shea | |
| 7,140,702 B2 | 11/2006 | Byron et al. | |
| 7,654,404 B2 | 2/2010 | Kadziolka et al. | |
| 8,074,408 B1* | 12/2011 | Motosko | E06B 9/02 52/202 |
| 8,598,484 B2 | 12/2013 | Engel et al. | |
| 8,648,274 B2 | 2/2014 | Carlson et al. | |
| 8,791,361 B2* | 7/2014 | Gingrich | H02B 1/565 174/17 VA |
| 9,025,299 B2 | 5/2015 | Shea et al. | |
| 9,318,883 B2 | 4/2016 | Schmidt et al. | |

(Continued)

FOREIGN PATENT DOCUMENTS

| | | |
|---|---|---|
| CN | 207038384 | 2/2018 |
| KR | 1020097016740 | 4/2007 |
| WO | WO2014/099344 | 6/2014 |

OTHER PUBLICATIONS

Manahan, et al. *Nema Type Hazardous-Area Enclosures*, IEEE Industry Applications Magazine; Apr. 27, 2015; pp. 46-55.

*Primary Examiner* — Harry R Behm
(74) *Attorney, Agent, or Firm* — Stanek Lemon Crouse & Meeks, P.A.

(57) ABSTRACT

A wall for an electrical equipment enclosure includes an outer panel, an inner panel having a first side facing a chamber of the enclosure and a second side facing the outer panel, and at least one flange spaced apart from the outer panel and facing at least one peripheral portion of the inner panel and configured to prevent movement of the at least one peripheral portion of the inner panel towards the outer panel. The first panel is configured to press the at least one peripheral portion against the at least one flange responsive to pressure generated by an arc flash to form a seal between a periphery of the inner panel and the at least one flange that impedes passage of arc flash gases.

17 Claims, 9 Drawing Sheets

(56) References Cited

U.S. PATENT DOCUMENTS

| | | |
|---|---|---|
| 9,609,769 B2 * | 3/2017 | Kingston ................ H01H 9/342 |
| 9,745,794 B2 | 8/2017 | Ellingson |
| 9,865,418 B2 | 1/2018 | Yang |
| 10,326,259 B2 * | 6/2019 | Bellows ................. H02B 1/565 |
| 2005/0210798 A1 * | 9/2005 | Burg ..................... E04B 2/7457 |
| | | 52/481.1 |
| 2007/0094967 A1 * | 5/2007 | Kosny ....................... E04B 1/14 |
| | | 52/309.9 |
| 2009/0173118 A1 | 7/2009 | Schulz et al. |
| 2017/0063052 A1 * | 3/2017 | Johnson ................. H02B 1/306 |
| 2017/0110857 A1 * | 4/2017 | Gasparetto ......... B01D 53/0407 |

* cited by examiner

EQUIPMENT ENCLOSURE WITH SELF-SEALING MULTILAYER WALL STRUCTURE

BACKGROUND

The inventive subject matter relates to electrical power apparatus and methods and, more particularly, to protection structures for electrical power equipment.

Arc faults may be caused by a variety of different events, including inadvertent dropping of metal tools on energized components, misalignment of switch contacts, failure of connections, and failed cable or bus insulation. Arc faults can produce arc flashes with sufficient energy to kill or injure personnel and significantly damage equipment.

Several techniques have been developed to mitigate the effects of arc faults. For example, equipment enclosures may be designed to contain and/or channel arc flash heat and gases to reduce or minimize exposure to personnel. Switchgear and similar equipment may also be equipped with active devices that may reduce arc flash energy. For example, U.S. Pat. No. 6,724,604 to Shea et al. and U.S. Pat. No. 9,025,299 to Shea et al. describe arc fault mitigation devices that can potentially reduce the likelihood and severity of personnel injury and equipment damage arising from arc faults.

SUMMARY

Some embodiments of the inventive subject matter provide a wall for an electrical equipment enclosure. The wall includes a frame defining an opening and having at least one flange adjacent the opening. A first panel is attached to the frame around a periphery of the opening. A second panel has at least one peripheral portion facing the at least one flange. The second panel is not directly attached to the at least one flange and is configured to press the at least one peripheral portion press against the at least one flange responsive to pressure applied to the second panel.

In some embodiments, the wall may include a brace that extends across the opening and the second panel may have a central portion that contacts the brace. The brace may be disposed on a first side of the second panel, the first panel may be disposed on a second side of the first panel and the second panel may be fastened to the brace. The brace may include, for example, a rib member having first and second ends attached to the frame at first and second sides of the opening. According to further embodiments, the brace may include a first brace on the first side of the second panel and the wall may further include second brace between the first panel and the second panel such that the second panel is disposed between the first brace and the second brace.

In some embodiments, a wall for an electrical equipment enclosure includes a rectangular frame and a first rectangular panel attached to the rectangular frame around a periphery thereof. First, second, third, and fourth flanges are disposed at respective ones of first, second, third and fourth sides of the frame. A first rib member extends between opposite sides of the rectangular frame. A second rectangular panel is disposed parallel to the first rectangular panel, attached to the first rib member, and has respective first second, third, and fourth peripheral portions that face respective ones of the first, second, third, and fourth flanges. A second rib member is disposed between the first and second rectangular panels and extends parallel to the first rib member. First, second, third and fourth angle members may be attached to the frame at respective ones of the first, second, third and fourth sides thereof and the first, second, third and fourth flanges may be flange portions of respective ones of the first, second, third and fourth angle members.

In further embodiments, a wall for an electrical equipment enclosure includes an outer panel, an inner panel having a first side facing a chamber of the enclosure and a second side facing the outer panel, and at least one flange spaced apart from the outer panel and facing at least one peripheral portion of the inner panel and configured to prevent movement of the at least one peripheral portion of the inner panel towards the outer panel. The inner panel is not attached to the flange.

DETAILED DESCRIPTION

Figure 1:
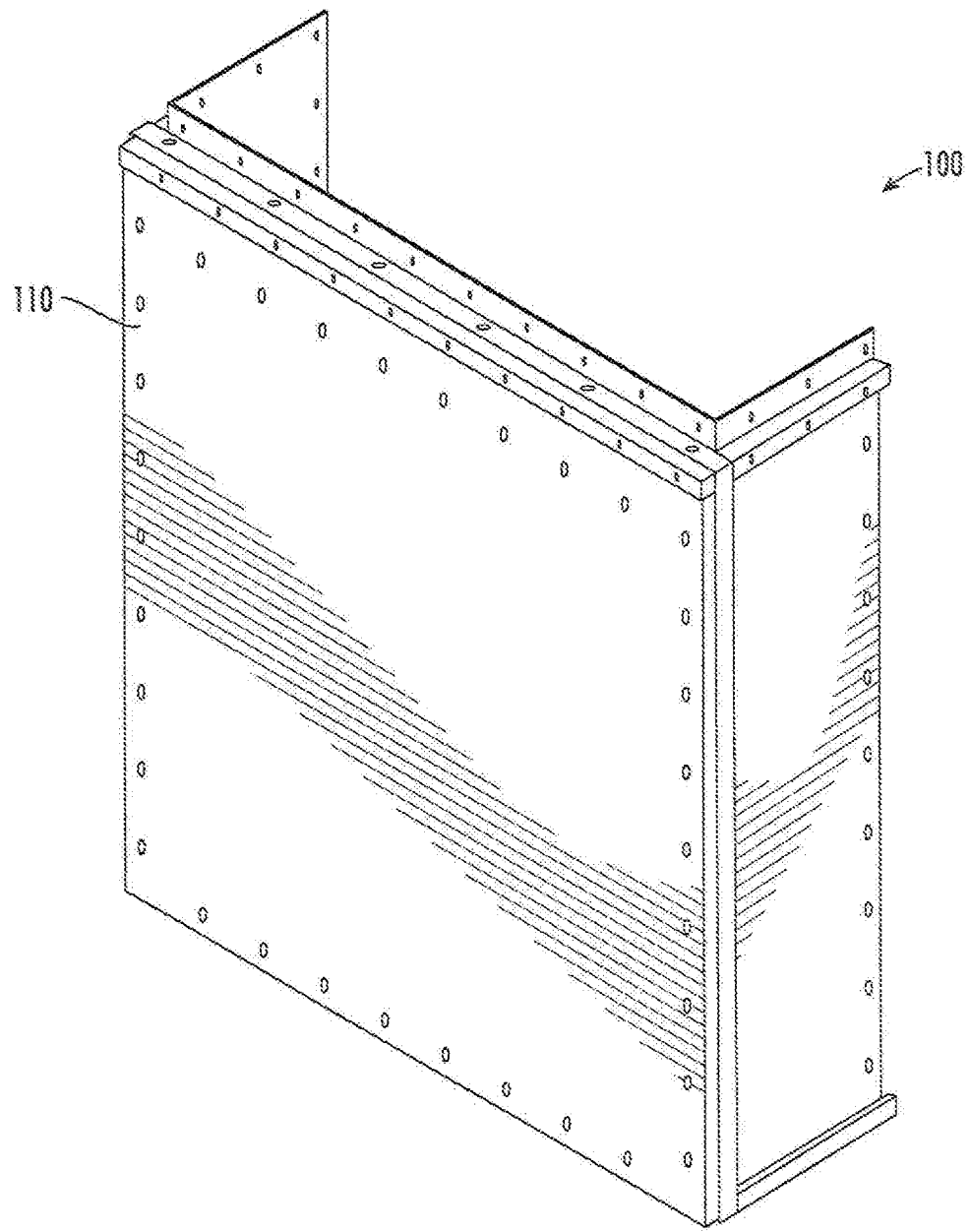
FIGS. 1 and 2 are perspective views of a portion of an enclosure with a self-sealing multilayer wall according to some embodiments.

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like items. It will be understood that when an item is referred to as being "connected" or "coupled" to another item, it can be directly connected or coupled to the other item or intervening items may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises." "including" and/or "comprising," when used in this specification, specify the presence of stated features, integers, steps, operations, items, and/or components, but do not preclude the presence or addition of one or more other features, integers, steps, operations, items, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Figure 2:
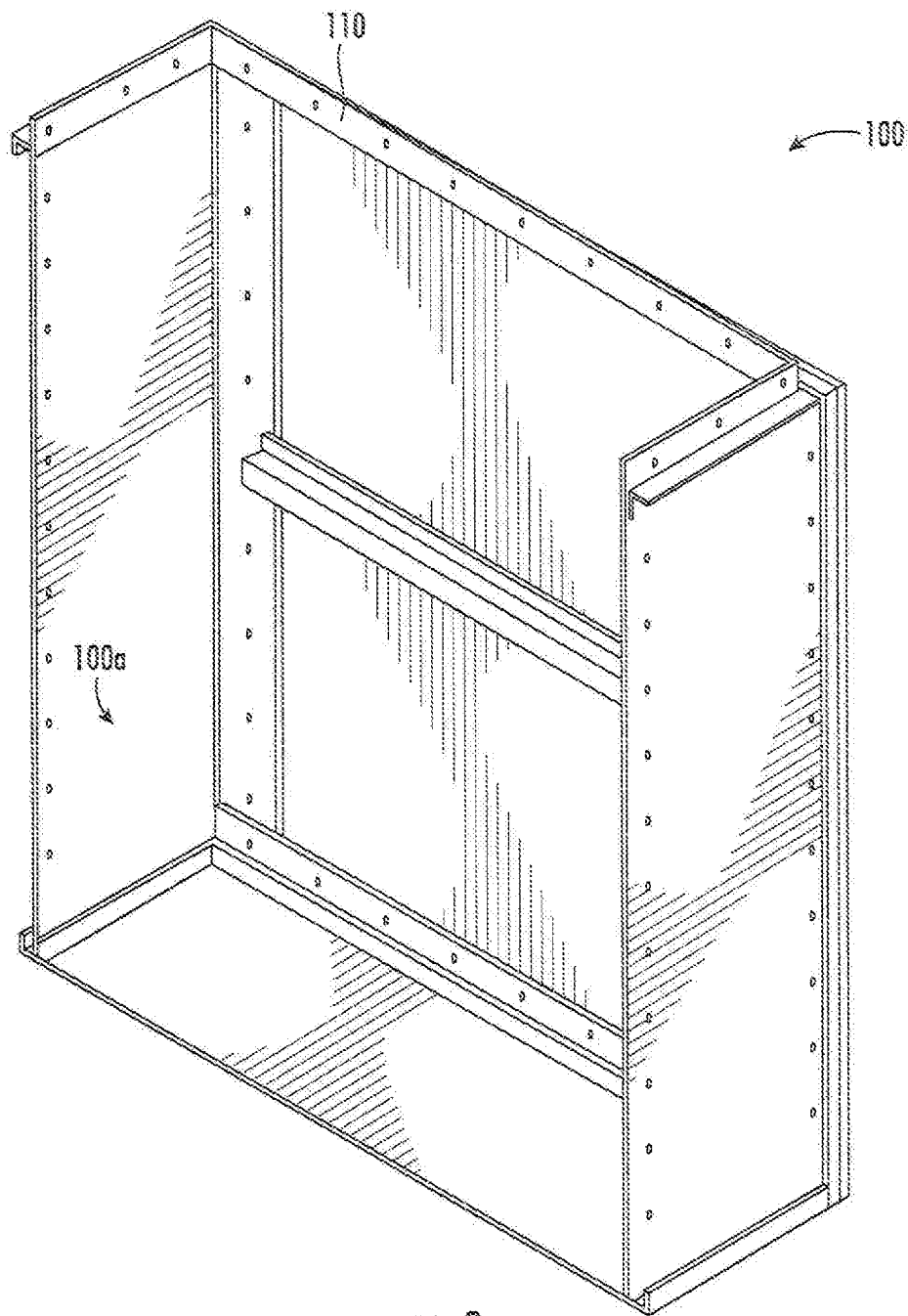

FIGS. 1 and 2 illustrate an enclosure 100 according to some embodiments. In particular, the enclosure 100 may be used to house electrical equipment, such as a switchgear, motor drive or the like, which may have an associated risk of an arc fault. The enclosure 100 includes a chamber 100a, which is bounded by a wall 110. According to some embodiments, the wall 110 has a multilayer, self-sealing structure that can reduce the likelihood that heat and gases from an arc flash occurring in the chamber 100a will pass through the enclosure 100, where they could expose personnel and/or other equipment to injury or damage.

Figure 3:
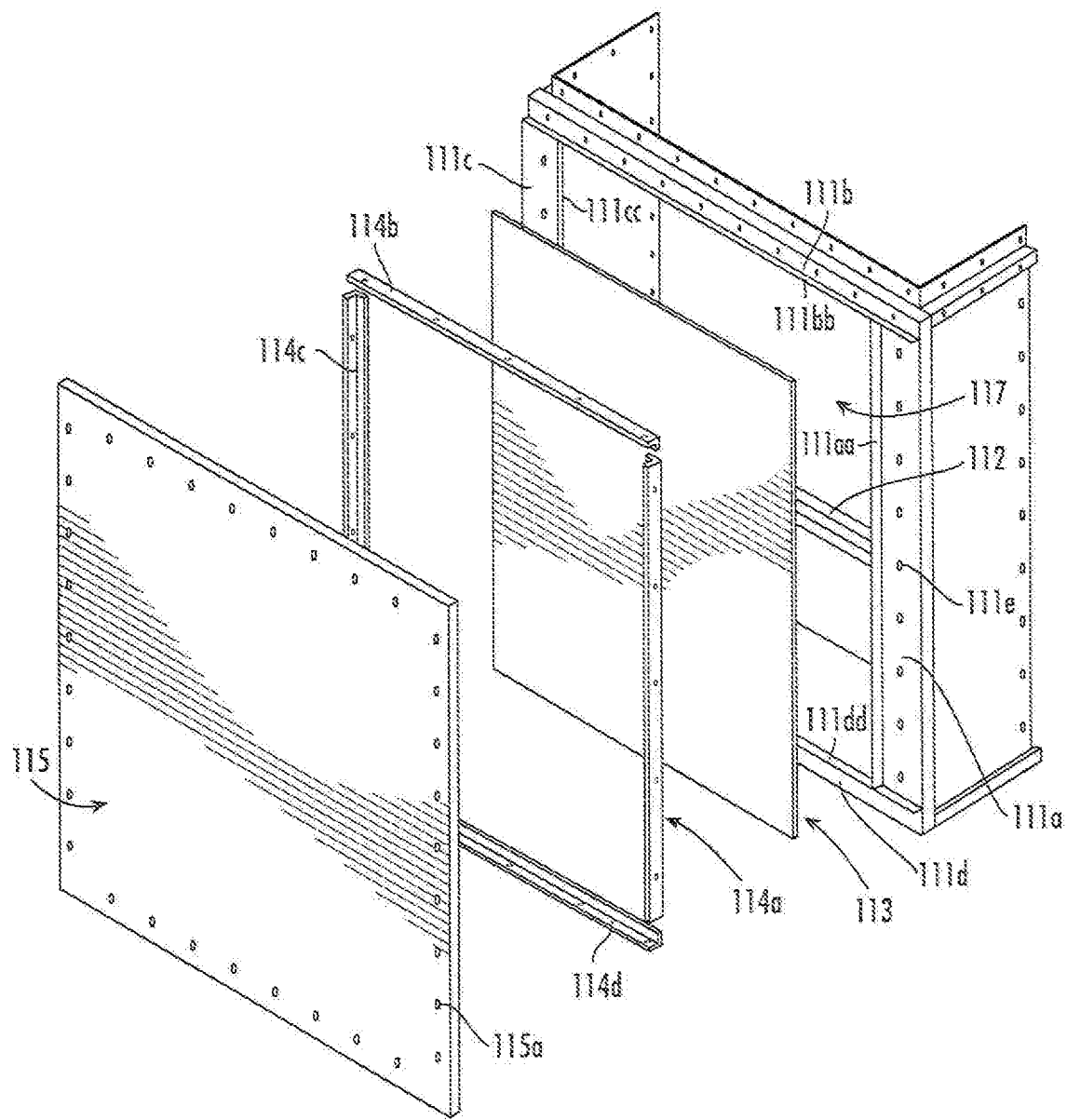
FIG. 3 is an exploded view of the enclosure of FIGS. 1 and 2.

FIG. 3 is an exploded view of the enclosure 100 of FIGS. 1 and 2. The wall 110 includes rectangular frame 111, which includes first, second, third and fourth frame members 111a, 111b, 111c, 111d that define a rectangular opening 117. In the illustrated embodiments, the frame members 111a, 111b, 111c, 111d have respective flanged portions 111aa, 111bb, 111cc, 111dd that are configured for mounting of respective angle members 114a, 114b. 114c. 114d thereto. The frame 111 may generally be fabricated from, for example, sheet metal (e.g., carbon or stainless steel), a composite or the like, and the frame members 111a, 111b, 111c, 111d may be, for example, channel members or similar structures fabricated by bending a sheet metal material or may be similar structures formed from other materials.

A first brace, here shown as a first rib member 112, spans the opening 117 and is attached at respective ends to two opposing ones of the frame members 111a, 111b. A central portion of a rectangular inner panel 113 is attached to the rib member 112, such that the inner panel 113 covers the opening 117, but in some embodiments, the rib member 112 may not be attached to the inner panel 113. An outer panel 115 is configured to be attached to the frame 11 around a periphery of the outer panel 115 using, for example, bolts or screws passing through holes 115a in the outer panel 115 and holes 111e in the frame 111. For example, the outer panel 115 may be attached to the frame 111 using bolts that pass through the holes 111e and engage nuts welded to the frame 111. The first, second, third and fourth angle members 114a, 114b. 114c, 114d are attached to the flanges 111aa, 111bb, 111cc, 111dd of the frame members 111a, 111b, 111c, 111d using, for example, bolts, screws, welds, adhesive or other fastening means. The angle members 114a, 114b, 114c, 114d can help provide a seal with an inner panel 113, as explained below.

Figure 4:
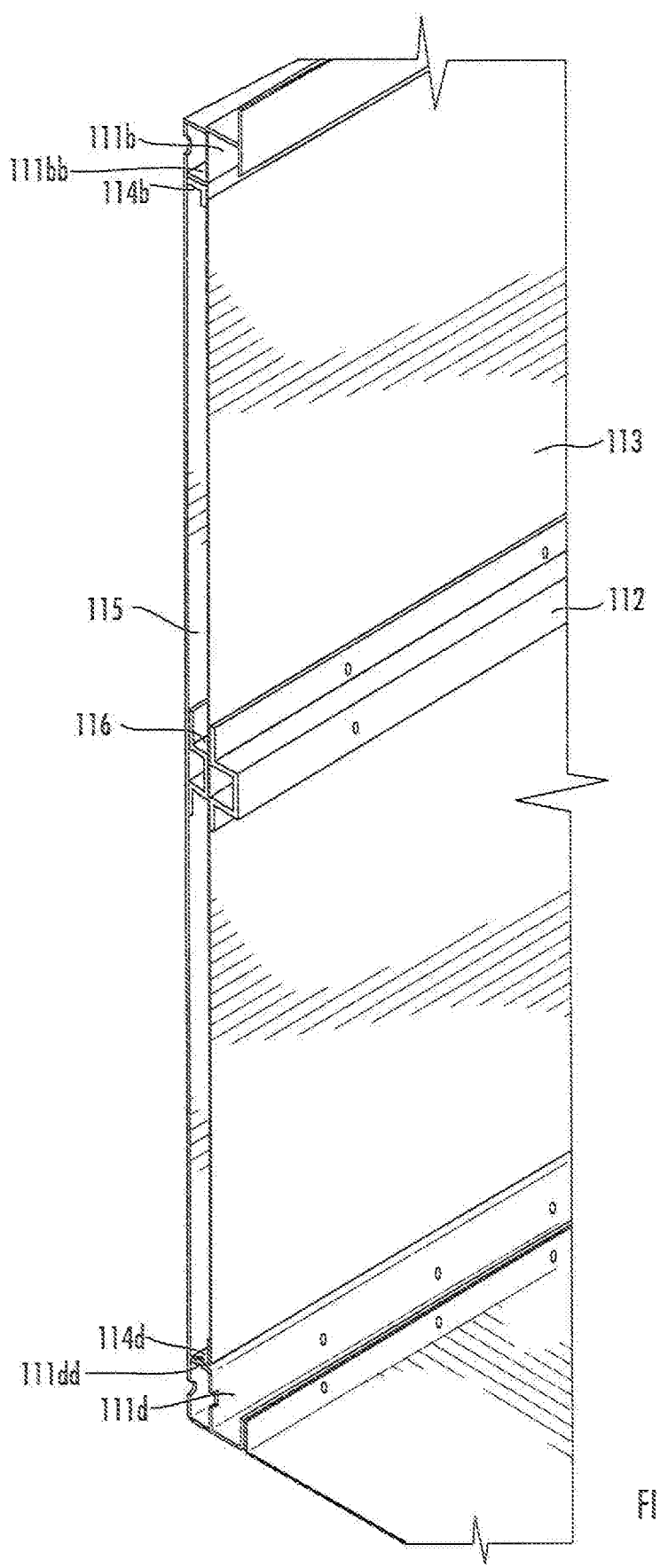
FIGS. 4 and 5 are detailed views of the wall of the enclosure of FIGS. 1 and 2.
Figure 5:
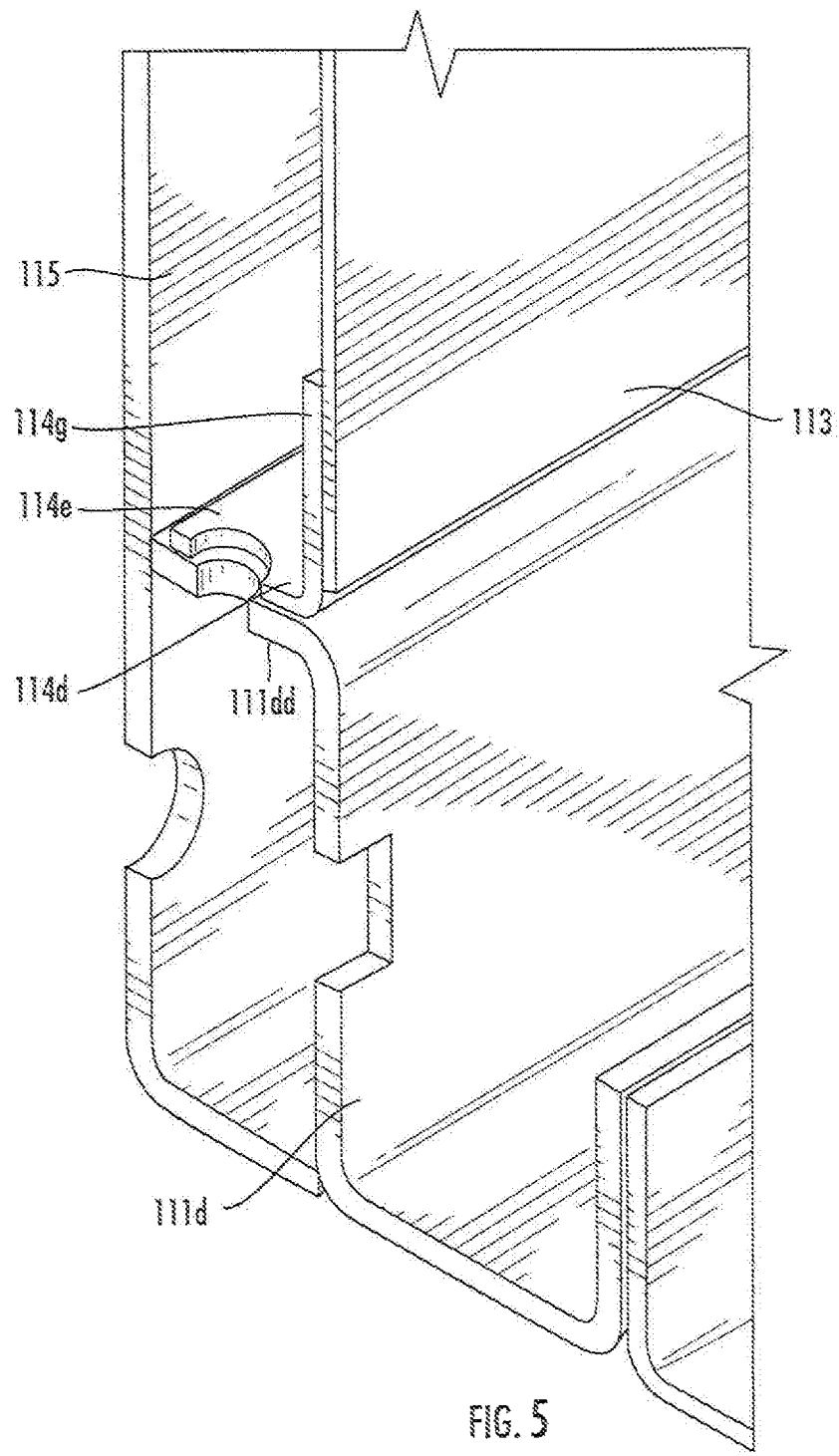

FIGS. 4 and 5 illustrate the structure of the wall 110 in greater detail. Referring to FIG. 4, the outer panel 115 may have a second brace, here shown as a second rib member 116, attached at an inner face of the outer panel 115 and substantially aligned with (parallel to) to the first rib member 112. The second rib member 116 may thus maintain a spacing between central portions of the the inner panel 113 and the outer panel 115. Although FIG. 4 illustrates the second rib 116 as being in close proximity to or touching the inner panel 113, in some embodiments, a gap may be provided between the second rib 116 and the inner panel 113.

Referring to FIGS. 3 and 5, a web portion 114e of the angle member 114d is attached to the flanged portion 111dd one of the frame members 111d of the frame 111, such that a flange portion 114g of the angle member 114d faces a peripheral portion of the inner panel 113, which can provide a similar spacing between peripheral portions of the inner panel 113 and the outer panel 115. Web portions 114e of the other angle members 114a, 114b, 114c may be similarly attached to respective flanged portions 111aa, 111bb, 111cc of the other frame members 111a, 111b, 111c, such that flanged portions 114g of these other angle members 114a, 114b, 114c face respective peripheral portions of the inner panel 113.

In some embodiments, the inner panel 113 is not directly attached to the angle members 114a, 114b, 114c, 114d, which allows the periphery of the inner panel 113 to move with respect to the angle members 114a, 114b, 114c, 114d. In the event of an arc flash in the chamber 100a of the enclosure 100, gas pressure may be applied to the to the inner panel 113 to cause the inner panel 113 to flex toward the outer panel 115 to absorb energy from the arc flash and press the periphery of the inner panel 113 against the flange portions 114g of the angle members 114a, 114b, 114c, 114d to form a seal that can impede transit of heat and gases towards the outer panel 115 and, thus, reduce the likelihood of the heat and gas escaping the enclosure 100. Although the illustrated embodiments illustrate the use of the angle members 114a, 114b, 114c, 114d attached to the frame members 111a, 111b, 111c, 111d to provide sealing flanges, similar sealing flanges may be integrated into the frame members 111a, 111b, 111c, 111d.

Figure 6:
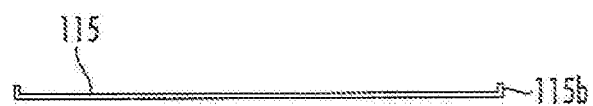
FIGS. 6-8 are isolated views of an outer panel of the enclosure of FIGS. 1 and 2.
Figure 7:
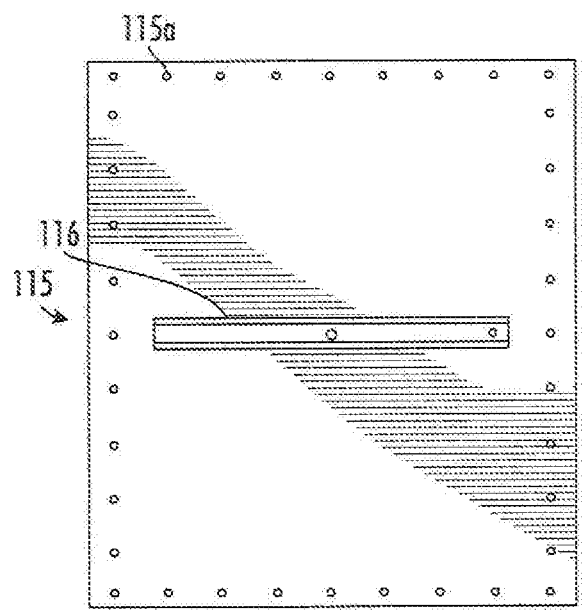
Figure 8:
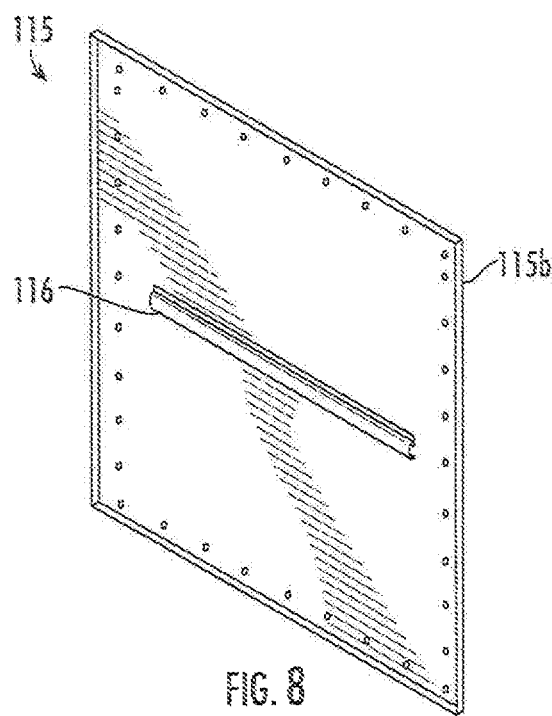

FIGS. 6-8 are isolated views of the outer panel 115. The outer panel 115 is a generally flat panel that may be fabricated from, for example, sheet metal (e.g., carbon or stainless steel), a composite and/or other materials. The rib member 116 may be fabricated from similar materials and may be attached to the outer panel 115 using, for example, welds, fasteners (e.g., screws or bolts), adhesives or the like. Holes 115a in the outer panel 115 are used to attach the outer panel 115 to the enclosure frame 111. As illustrated, the outer panel 115 may have rolled edges 115b.

Figure 11:
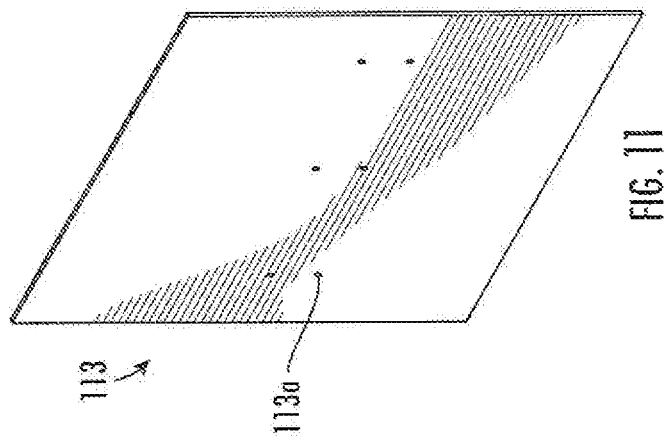
FIGS. 9-11 are isolated views of an inner panel of the enclosure of FIGS. 1 and 2.
Figure 10:
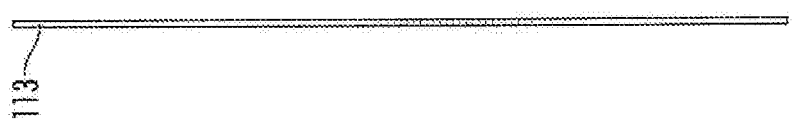
Figure 9:
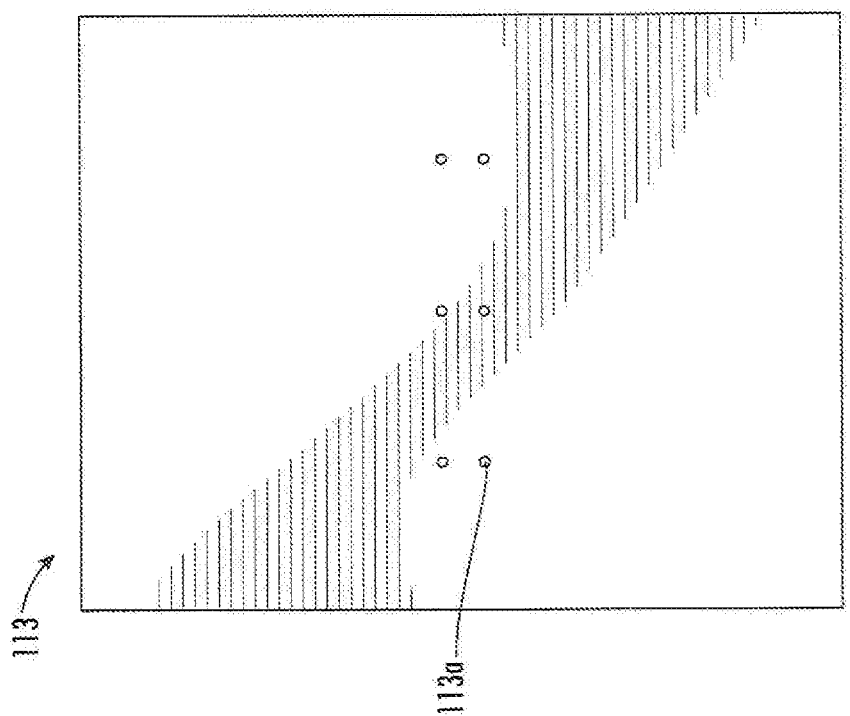
Figure 12:
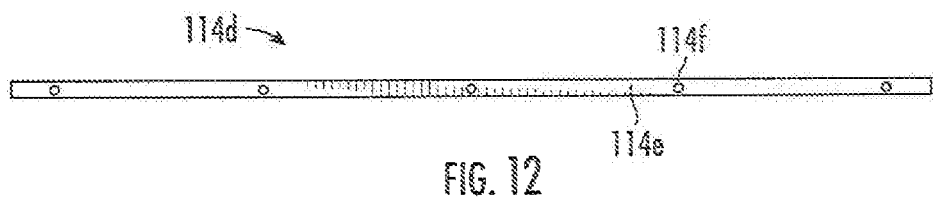
FIGS. 12-15 are isolated views of an angle member of the enclosure of FIGS. 1 and 2.
Figure 13:
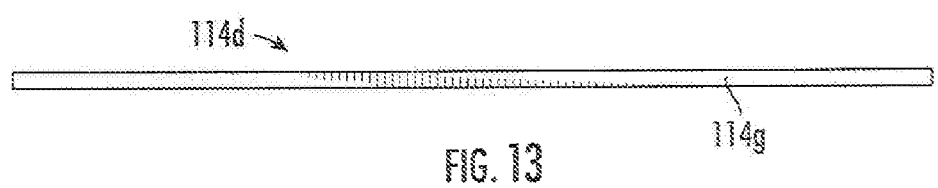
Figure 14:
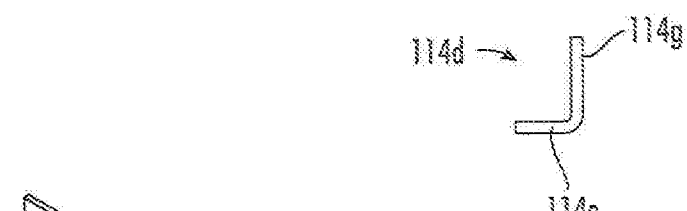
Figure 15:
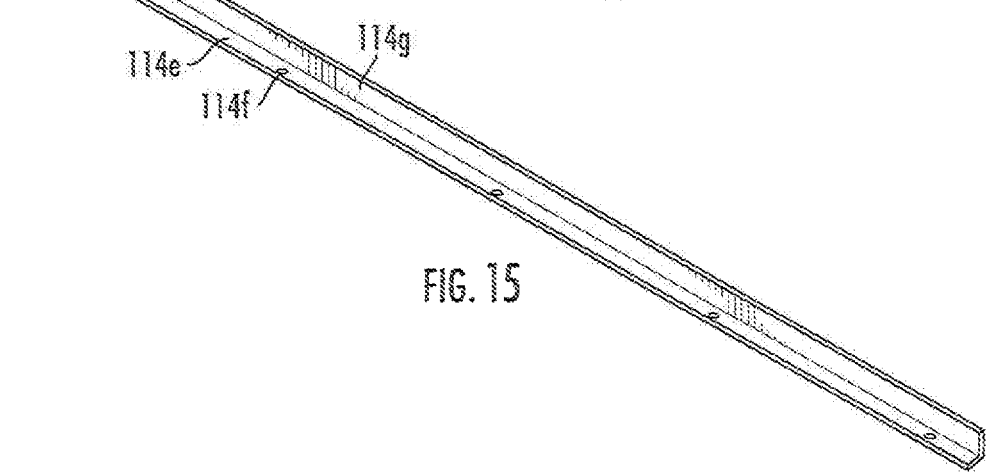
Figure 16:
FIGS. 16-19 are isolated views of a bracing rib of the enclosure of FIGS. 1 and 2.
Figure 17:
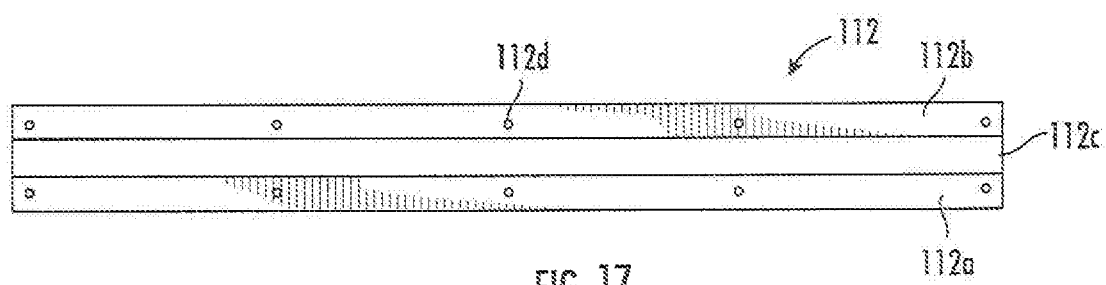
Figure 18:
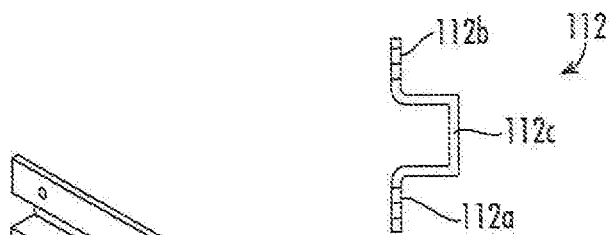
Figure 19:
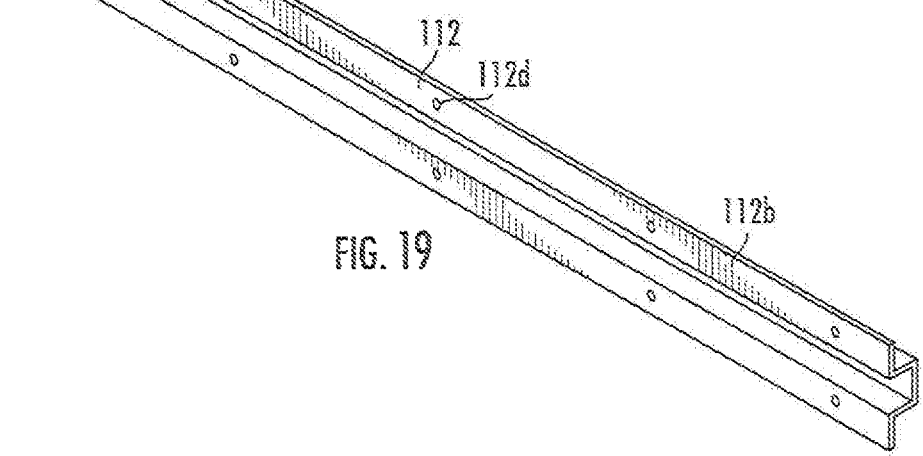

FIGS. 9-11 are isolated views of the inner panel 113. The inner panel 113 may be a substantially planar sheet fabricated from, for example, sheet metal (e.g., carbon or stainless steel), a composite and/or other materials. Holes 113a are provided along a midline of the inner panel 113 to allow for attachment to the bracing rib member 112 using, for example, screws, bolts, welds, adhesive or other fastening means.

FIGS. 12-16 are isolated views of the angle member 114d. The angle member 14d includes a web portion 114e, which has holes 114f formed therein for attaching the angle member 114d to the frame member 111d of the frame 111 (see FIGS. 3 and 5 and description thereof) using bolts, screws or other fasteners. The angle member 114d also includes a flange portion 114g which is configured to face a peripheral portion of the inner panel 113 (see FIGS. 3-5 and description thereof). The angle member 114d may be fabricated from, for example, sheet metal (e.g., carbon or stainless steel), a composite and/or other materials. The angle members 114a, 114b, 114c may have a similar structure to the angle member 114d and may be similarly attached to respective one of the other frame members 111a, 111b, 111c of the frame 111, such that the flange portions 114g of the angle members 114a, 114b. 114c face respective peripheral portions of the inner panel 113.

FIGS. 16-19 are isolated view of the first bracing rib member 112. The first rib member 112 has a center portion 112c with a U-shaped cross section and adjacent flange portions 112a, 112b. Holes 112d are provided in the flange portions 112a, 112b to enable attachment of the rib member 112 to the inner panel 113 (see FIGS. 3 and 4 and description thereof). The rib member 112 may be fabricated from, for example, sheet metal (e.g., carbon or stainless steel), a composite and/or other materials. The second bracing rib member 116 shown in FIGS. 7 and 8 may have a similar structure to the first bracing rib member 112.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A wall for an electrical equipment enclosure, the wall comprising:
a frame defining an opening and having first and second flanges on opposite sides of the opening;
a brace extending across the opening;
a first panel attached to the frame and covering the opening; and
a second panel disposed parallel to the first panel and having a peripheral first portion facing the first flange and a peripheral second portion facing the second flange, wherein the second panel is not attached to the first and second flanges, wherein the brace is disposed on a first side of the second panel, wherein the first panel is disposed on a second side of the second panel, wherein the second panel has a central portion contacting the brace, wherein the second panel is fastened to the brace and wherein the second panel flexes towards the first panel responsive to gas pressure applied to the second panel while the peripheral first and second portions are retained by the first and second flanges, respectively.

2. The wall of claim 1, wherein the frame comprises:
first, second, third and fourth frame members on respective sides of the opening; and
first, second, third and fourth angle members on respective ones of the first, second, third and fourth frame members and having respective first, second, third and fourth flange portions that face respective first, second, third, and fourth peripheral portions of the second panel.

3. An enclosure comprising the wall of claim 1.

4. The wall of claim 1:
wherein the frame comprises a rectangular frame;
wherein the first panel comprises a first rectangular panel attached to the rectangular frame around a periphery thereof;
wherein the frame comprises first, second, third, and fourth flanges disposed at respective ones of first, second, third and fourth sides of the frame;
wherein the brace comprises a first rib member extending between opposite sides of the rectangular frame;
wherein the second panel comprises a second rectangular panel parallel to the first rectangular panel, attached to the first rib member, and having respective first second, third, and fourth peripheral portions that face respective ones of the first, second, third, and fourth flanges; and
wherein the brace further comprises a second rib member between the first and second rectangular panels and extending parallel to the first rib member.

5. The wall of claim 4, further comprising first, second, third and fourth angle members attached to the frame at respective first, second, third and fourth sides thereof and wherein the first, second, third and fourth flanges are flange portions of respective ones of the first, second, third and fourth angle members.

6. The wall of claim 4, wherein the second rectangular panel faces a chamber of the enclosure and is configured to press against the first, second, third, and fourth flanges responsive to pressure generated by an arc flash generated in the chamber to form a seal between a periphery of the second rectangular panel and the first, second, third, and fourth flanges that impedes passage of gases from the arc flash toward the first rectangular panel.

7. An enclosure comprising the wall of claim 4.

8. A wall for an electrical equipment enclosure, the wall comprising:
a frame defining an opening and having second flanges on opposite sides of the opening;
a first panel attached to the frame and covering the opening; and
a second panel disposed parallel to the first panel and having a peripheral first portion facing the first flange and a peripheral second portion facing the second flange, wherein the second panel is not attached to the first and second flanges, wherein the second panel flexes towards the first panel responsive to gas pressure applied to the second panel while the peripheral first and second portions are retained by the first and second flanges, respectively, wherein the second panel faces a chamber of the enclosure and wherein the second panel is configured to press the peripheral first and second portions against the first and second flanges, respectively, responsive to pressure generated by an arc flash generated in the chamber to form a seal that impedes passage of arc flash gases from the chamber.

9. The wall of claim 8, further comprising a brace extending across the opening and wherein the second panel has a central portion contacting the brace.

10. The wall of claim 9, wherein the brace comprises a rib member having first and second ends attached to the frame at first and second sides of the opening.

11. The wall of claim 9, wherein the brace is disposed on a first side of the second panel, wherein the first panel is disposed on a second side of the second panel and wherein the second panel is fastened to the brace.

12. The wall of claim 11, wherein the brace comprises a first brace on the first side of the second panel and further comprising a second brace between the first panel and the second panel such that the second panel is disposed between the first brace and the second brace.

13. The wall of claim 12, wherein the opening is rectangular, wherein the first brace comprises a first rib member having first and second ends attached to the frame at first and second sides of the opening, and wherein the second brace comprises a second rib member attached to the first panel and extending parallel to the first rib member.

14. A wall for an electrical equipment enclosure, the wall comprising:
an outer panel;
an inner panel having a first side facing a chamber of the enclosure and a second side facing the outer panel; and
a rectangular frame comprising first, second, third and fourth frame members arranged in a rectangle and respective first, second, third, and fourth angle members attached to respective ones of the first, second, third, and fourth frame members, wherein the outer panel is attached to the first, second, third, and fourth frame members round a periphery of the outer panel, and wherein the first, second, third and fourth angle members comprise respective first, second, third and fourth flange portions spaced apart from the outer panel, facing respective first, second, third and fourth peripheral portions of the inner panel and configured to prevent movement of the first, second, third and fourth peripheral portions of the inner panel towards the outer panel, wherein the first, second, third and fourth peripheral portions of the inner panel are not attached to the flange.

15. The wall of claim 14, further comprising a brace extending between opposite ones of the first, second, third and fourth frame members and contacting the inner panel.

16. The wall of claim 15, wherein the brace comprises a first brace attached to the inner panel on the first side of the inner panel and a second brace disposed on the second side of the inner panel between the inner panel and the outer panel.

17. The wall of claim 14, wherein the inner panel faces a chamber of the enclosure and wherein the first panel is configured to press the first, second, third and fourth peripheral portions against respective ones of the first, second, third and fourth flange portions responsive to pressure generated by an arc flash generated in the chamber to form a seal between a periphery of the inner panel and the first, second, third and fourth flange portions that impedes passage of arc flash gases from the chamber toward the outer panel.

\* \* \* \* \*

UNITED STATES PATENT AND TRADEMARK OFFICE
CERTIFICATE OF CORRECTION

| | |
|---|---|
| PATENT NO. | : 11,158,999 B2 |
| APPLICATION NO. | : 16/444765 |
| DATED | : October 26, 2021 |
| INVENTOR(S) | : Richard Bhalla |

It is certified that error appears in the above-identified patent and that said Letters Patent is hereby corrected as shown below:

On the Title Page

(73) Assignee: Please correct Assignee to read -- Eaton Intelligent Power Limited (IE) --

In the Specification

Column 3, Line 36: Please correct "attached to frame 11" to read -- attached to frame 111 --

Signed and Sealed this
Third Day of May, 2022

*Katherine Kelly Vidal*

Katherine Kelly Vidal
*Director of the United States Patent and Trademark Office*